United States Patent [19]
Ino et al.

[11] Patent Number: 5,302,230
[45] Date of Patent: Apr. 12, 1994

[54] HEAT TREATMENT BY LIGHT IRRADIATION

[75] Inventors: Masumitsu Ino, Yokohama; Katsuhiko Tani, Tokyo, both of Japan

[73] Assignee: Ricoh Company, Ltd., Tokyo, Japan

[21] Appl. No.: 741,237

[22] Filed: Aug. 5, 1991

Related U.S. Application Data

[63] Continuation of Ser. No. 485,826, Feb. 27, 1980, abandoned, which is a continuation of Ser. No. 223,689, Jul. 25, 1988, abandoned, which is a continuation of Ser. No. 818,121, Jan. 10, 1986, abandoned.

[30] Foreign Application Priority Data

| Jan. 11, 1985 | [JP] | Japan | 60-2033 |
| Jan. 14, 1985 | [JP] | Japan | 60-3178 |
| Apr. 1, 1985 | [JP] | Japan | 60-66588 |
| Apr. 1, 1985 | [JP] | Japan | 60-66589 |

[51] Int. Cl.$^5$ ............................... C30B 1/02
[52] U.S. Cl. .................. 156/603; 156/DIG. 64; 156/DIG. 69; 156/DIG. 73; 156/DIG. 80
[58] Field of Search ............ 156/603, 620.72, 624, 156/DIG. 64, DIG. 69, DIG. 73, DIG. 80, DIG. 102; 148/DIG. 3, DIG. 4, DIG. 90; 437/247

[56] References Cited

U.S. PATENT DOCUMENTS

| 3,142,596 | 7/1964 | Theurer | 156/603 |
| 4,330,363 | 5/1982 | Biegesen et al. | 156/603 |
| 4,343,829 | 8/1982 | Tochikubo | 156/DIG. 80 |
| 4,402,771 | 9/1983 | Thomas | 156/DIG. 69 |
| 4,448,632 | 5/1984 | Akasaka | 156/DIG. 102 |
| 4,540,452 | 9/1985 | Croset et al. | 148/DIG. 3 |

FOREIGN PATENT DOCUMENTS

| 60-144931 | 7/1985 | Japan | 148/DIG. 4 |
| 60-161396 | 8/1985 | Japan | 148/DIG. 3 |

OTHER PUBLICATIONS

Tsaur et al, Epitaxial Alignment of Polycrystalline Si Films on Si, Applied Physics Letters. 37(7) Oct. 1, 1980 pp. 648 to 651.

Staebler et al, Conductivity Changes in Dehydrogenated and Rehydrogenated Discharge Produced Si-H, Applied Physics Letters, 37(7) Oct. 1, 1980 pp. 609-612.

Nishiyama et al, Radiation Annealing of Boron-Implanted Silicon with a Halogen Lamp, Japan Jour. of Applied Physics, vol. 19, No. 10, Oct. 1980 pp. L563-L566.

Narayan et al (II), Laser-Solid Interactions and Transient Thermal Processing of Materials, Elsevier Science Publishing Co. 1983, pp. 5694 to 574.

Narayan et al (II), "Laser Solid Interactions and Transient Thermal Processing of Materials", Elsevier Science Publishing Co., 1983, pp. 523 to 524

Olsen et al, "Laser Induced Solid Phase Crystallization in Amorphous Silicon Films in Laser Solid Interactions and Transient Thermal Processing of Materials" Elsevier Science Publishing Co. 1983, 141-154.

Primary Examiner—Robert Kunemund
Attorney, Agent, or Firm—Cooper & Dunham

[57] ABSTRACT

A thin film of silicon is formed on an electrically insulating substrate, such as transparent quarts, by deposition, such as glow discharge or CVD method. The thin film of silicon thus formed normally does not have a monocrystalline structure, but, in this manner, the thin film of silicon can be formed on a relatively large surface area. The substrate having formed thereon the thin film is then placed on a support plate, preferably, of a silicon wafer, and, then, a blanket light irradiation is carried out by a plurality of tungsten halogen lamps. The light irradiated from the lamps is preferentially absorbed by the support plate of silicon wafer which is thus heated and then transfers heat to the thin film by conduction. Thus, the thin film is heated uniformly by heat conduction so that the thin film is heat treated, thereby obtaining a desired property. For example, the thin film is monocrystallized uniformly.

36 Claims, 9 Drawing Sheets

FIG. 1
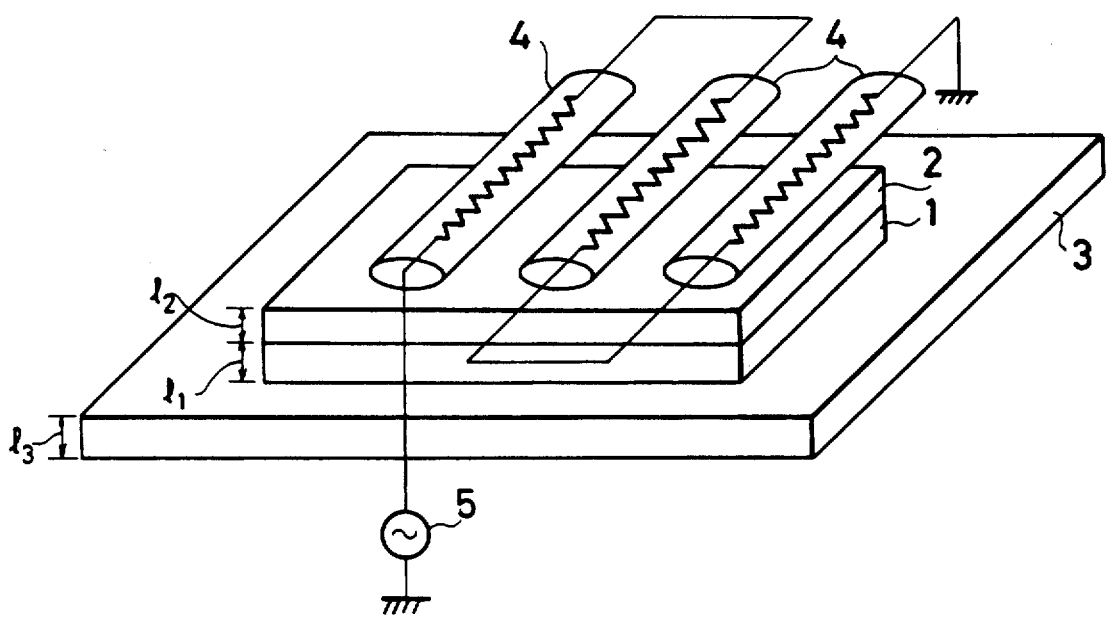
FIG. 2
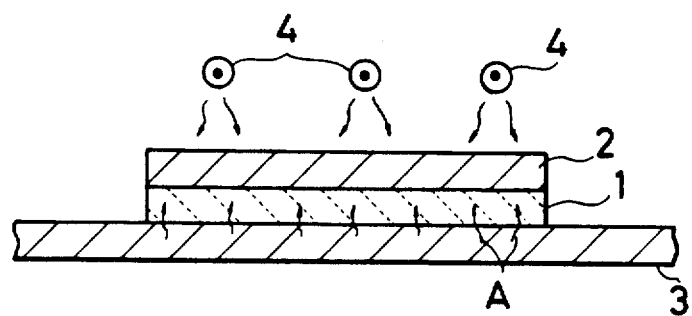
FIG. 3a
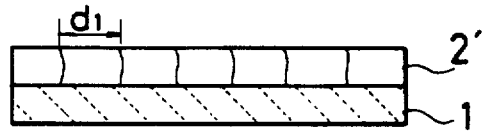
FIG. 3b
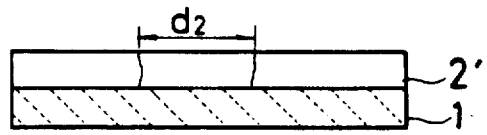
FIG. 3c

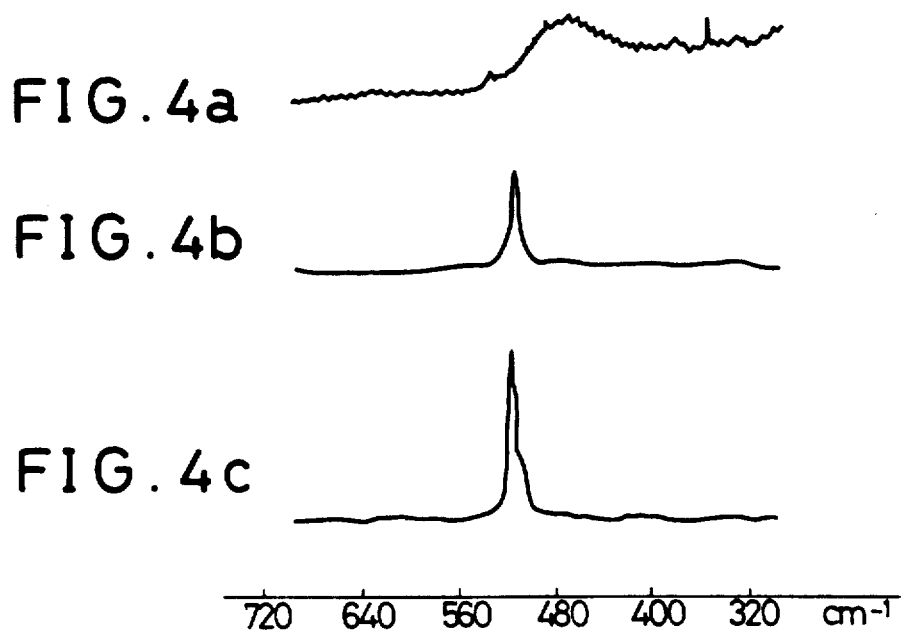
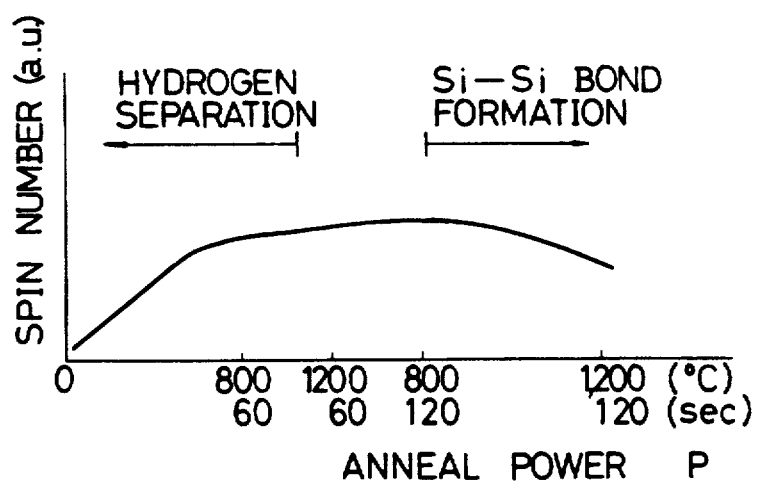

FIG. 7
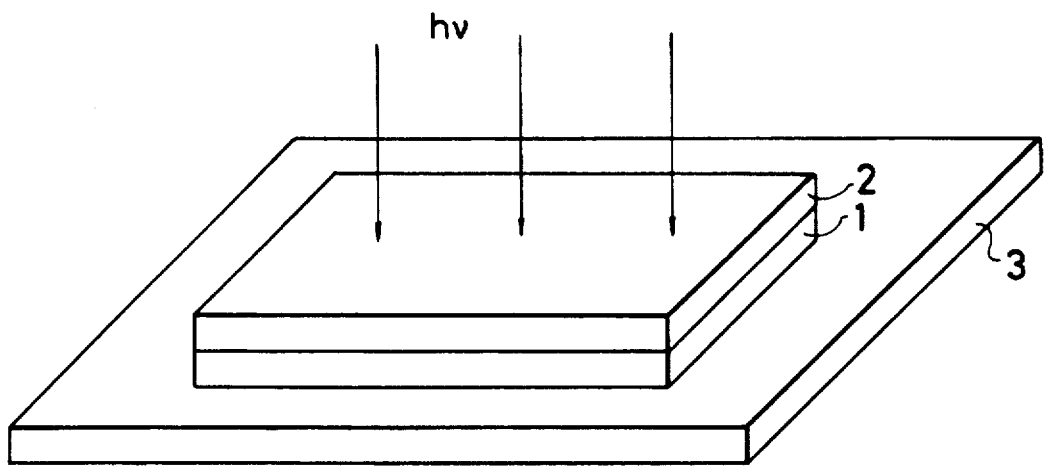
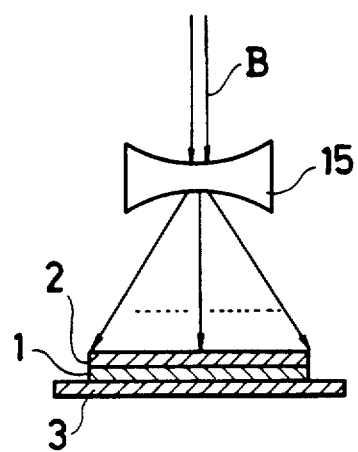
FIG.8a
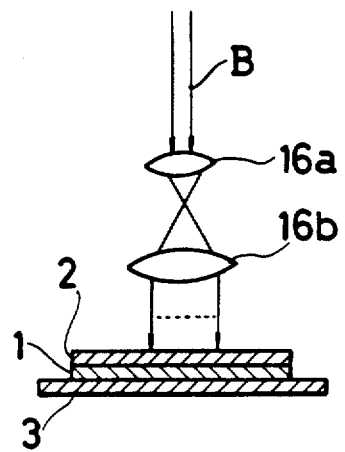
FIG.8b
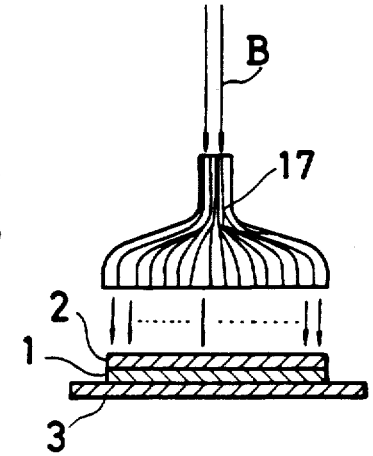
FIG.8c

FIG. 9
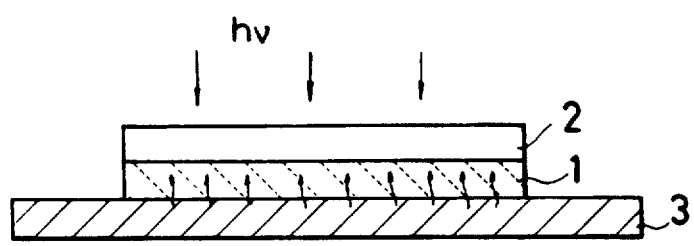
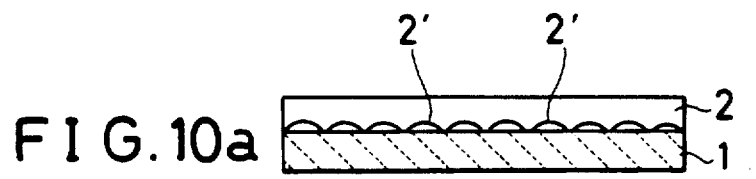
FIG. 10a
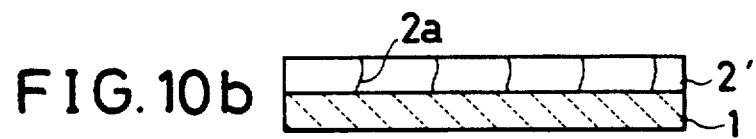
FIG. 10b
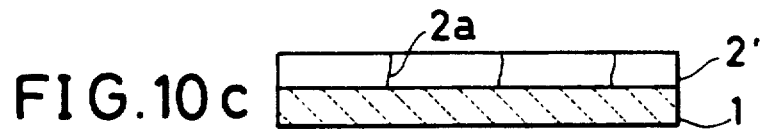
FIG. 10c

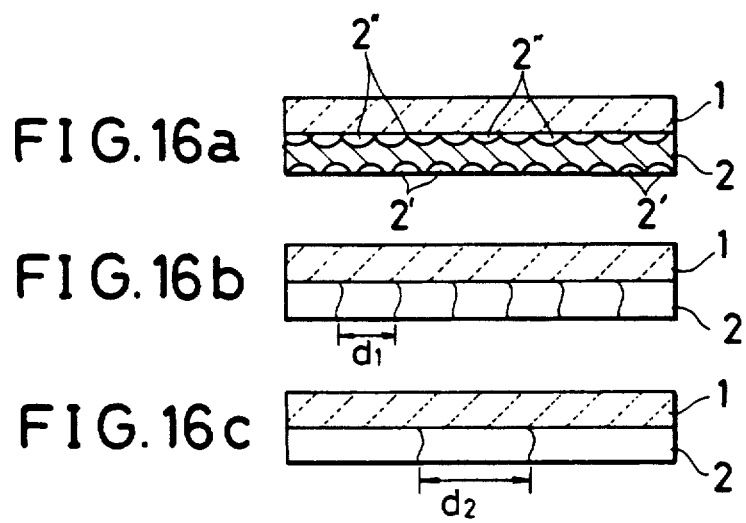

HEAT TREATMENT BY LIGHT IRRADIATION

This is a continuation of application Ser. No. 485,826, filed Feb. 27, 1990, now abandoned which in turn is a continuation of application Ser. No. 223,689, filed Jul 25, 1988 (abandoned, which in turn is a continuation of application Ser. No. 818.121 filed Jan. 10, 1986 (abandoned).

BACKGROUND OF THE INVENTION

1. Field of the Invention

This invention generally relates to a method of heat treatment by irradiation, and, in particular, to a method of heat-treating a thin film utilizing irradiation of light. More specifically, the present invention relates to a method for annealing a thin film formed on a substrate so as to provide a desired property to the thin film, such as single crystalline or microcrystalline structure or photoconductive characteristic.

2. Description of the Prior Art

It is well known to deposit a thin film on a support which has a relatively large surface and which is not crystalline in structure and to anneal this thin film by a laser beam, an electron beam, etc., thereby providing a single crystalline structure in the thin film. Such a prior art method allows to form a single crystalline thin film large in surface area, which is expected to contribute to various improvements in such electronics devices as a switching device for driving a liquid crystal display, a switching device for a unity magnification photosensor, and CCD image sensor.

However, in the prior art method, since the thin film deposited on the support does not normally have a desired single crystalline structure and it is often amorphous or polycrystalline, in, structure, the thin film must be annealed to give it desired properties. For this purpose, the thin film is heat-treated to obtain a single crystalline structure, for example. In accordance with the prior art method, in such a case, use is normally made of a laser beam or an electron beam to carry out annealing of the thin film; however, such a beam annealing requires scanning an annealing beam across the large surface area so that there must be provided a control system for beam scanning, and, moreover, such a prior art method is significantly time consuming.

SUMMARY OF THE INVENTION

In accordance with the present invention, there is provided a method for heat-treating a thin film formed on a substrate using irradiation of light having a particular wavelength. That is, in accordance with the principle of the present invention, the substrate having formed thereon the thin film is placed on a support plate and a blanket irradiation of light is carried out such that the light is first absorbed by the support plate which is thus heated and then heats the thin film through thermal conduction. In this case, the substrate with the thin film may be placed on the support plate such that the substrate is in contact with the support plate or the thin film is in contact with the support plate.

When the thin film is so heat-treated, it is provided with desired characteristics or structures. For example, a single crystalline structure can be provided or a semiconductor structure exhibiting a photoconductive characteristic can be provided in the thin film.

In the preferred embodiment, the support plate is comprised of a silicon wafer and the blanket irradiation is carried out by at least one tungsten halogen lamp. In this case, if the substrate on which the thin film is formed is quartz and the thin film is amorphous silicon, the light irradiated from the tungsten halogen lamp is preferentially absorbed by the support plate, so that the support plate is first heated and then the heat is supplied to the substrate and the thin film through conduction, thereby heating the thin film. For example, if the substrate having thereon the thin film is placed on the support plate, the substrate is first heated by thermal conduction from the support plate and then the thin film is heated by thermal conduction from the substrate. And, single crystallization takes place at the boundary between the substrate and the thin film, and, once single crystalline silicon is formed at the boundary, thus formed single crystalline silicon will absorb the light irradiation, thereby effecting self-heating, so that the annealing process becomes accelerated. If the substrate having thereon the thin film is placed on the support plate with the thin film in contact with the support plate, the substrate is subjected to less heat, which is advantageous because a selection may be made from a wider range for the substrate. In this manner, in accordance with the present invention, the thin film is heat-treated all at once across the entire surface area, which is advantageous because the property of the resulting thin film is uniform across the entire surface area and it can be carried out in a short period of time.

It is therefore a primary object of the present invention to obviate the disadvantages of the prior art as described above and to provide an improved method for heat-treating a thin film.

Another object of the present invention is to provide a method of heat-treating a thin film easily as well as quickly.

A further object of the present invention is to provide a method for annealing a thin film so as to provide a desired structure, such as a single crystalline structure, therein.

A still further object of the present invention is to provide a method for annealing a thin film so as to provide a desired property, such as photoconductivity, thereto.

A still further object of the present invention is to provide an improved method for manufacturing a single crystalline thin film having a relatively large surface area.

A still further object of the present invention is to provide an improved method for manufacturing a semiconductor thin film having a relatively large surface area and exhibiting a photoconductive characteristic.

Other objects, advantages and novel features of the present invention will become apparent from the following detailed description of the invention when considered in conjunction with the accompanying drawings.

BRIEF DESCRIPTION OF THE DRAWINGS

FIG. 1 is a schematic, perspective illustration showing a method of heat-treating a thin film in accordance with one embodiment of the present invention;

FIG. 2 is a schematic, cross sectional illustration of the structure shown in FIG. 1;

FIGS. 3a through 3c are schematic, cross sectional illustrations showing in sequential steps how the thin film is mono-crystallized in accordance with the structure shown in FIGS. 1 and 2;

FIGS. 4a through 4c are graphs showing the experimental results for evaluation of crystal by the Raman spectrum;

FIG. 5 is a graph showing the relation between the anneal power and the spin number;

FIG. 7 is a schematic, perspective illustration showing a method of heat-treating a thin film in accordance with another embodiment of the present invention;

FIGS. 8a through 8c are schematic illustrations showing several specific examples to implement the embodiment shown in FIG. 7;

FIG. 9 is a schematic, cross sectional illustration useful for explaining the principle of this embodiment of the present invention;

FIGS. 10a through 10c are schematic, cross sectional illustrations showing the sequential changes in the structure of the thin film when this embodiment of the present invention is carried out;

FIGS. 16a through 16c are schematic, cross sectional illustrations showing how the thin film 2 is monocrystallized in accordance with a still further embodiment of the present invention.

DESCRIPTION OF THE PREFERRED EMBODIMENTS

Figure 6:
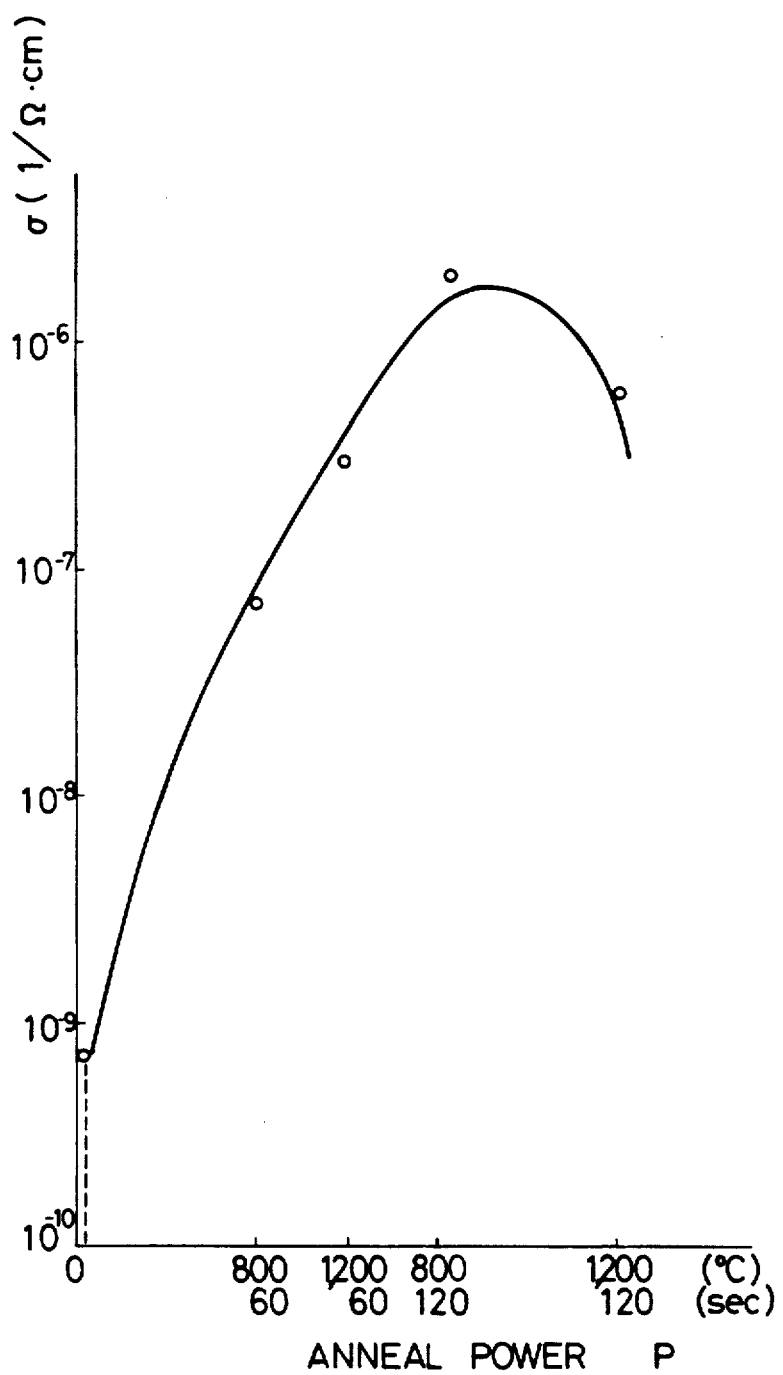
FIG. 6 is a graph showing the relation between the anneal power and the dark conductivity.

Referring now to FIGS. 1 and 2, there is schematically shown a method of heat-treating a thin film in accordance with one embodiment of the present invention. As shown, an electrically insulating substrate 1 is generally in the shape of a flat plate relatively large in surface area, and a thin film 2 is formed on the top surface of the substrate 1, for example, by deposition from a selected semiconductor material, such as silicon. The thin film 2 is formed on the substrate 1, for example, by the glow discharge method or the CVD method, and, thus, the thin film 2 does not have a single crystalline structure and probably has a random structure, such as amorphous, microcrystalline, or polycrystalline structure, or a combination thereof.

The substrate 1 having thereon the thin film 2, which is yet to have a single crystalline structure, is placed on a support plate 3 with the substrate 1 in contact therewith. In the illustrated embodiment, the support plate 3 is comprised of a single crystalline silicon wafer having the (100) crystal direction. Above the thin film 2 is located a plurality (three in the illustrated embodiment) of tungsten halogen lamps 4 which are arranged side-by-side and connected in series with a power supply 5. It is to be noted that there can be provided as many lamps 4 as desired and the number of lamps 4 should not be limited to three as illustrated. What is important here is that so many lamps 4 should be provided so as to be able to apply light irradiation to the thin film 2 across its entire surface. Thus, when the lamps 4 are energized, the light irradiation is applied to the entire surface of the thin film 2. In this case, the substrate 1 should be comprised of a material through which the light irradiation from the lamps 4 can transmit without appreciable absorption. In the case where the lamps 4 are tungsten halogen lamps, the substrate 1 is preferably comprised of a material, such as transparent quartz.

Single crystalline silicon has a large light absorbing characteristic for the light irradiated from the tungsten halogen lamps 4, so that, when light irradiation is carried out by the lamps 4, the support plate 3 comprised of single crystalline silicon is first heated due to absorption of light from the lamps 4, and, then, the heat thus produced in the support plate 3 is transferred first to the substrate 1 and then to the thin film 2 through conduction, as illustrated by the wavy arrows A in FIG. 2. As this heat transfer through conduction progresses, the thin film starts to become monocrystallized at the boundary with the substrate 1 as indicated by 2' in FIG. 3a. Once the monocrystalline silicon 2' is formed at the surface of the thin film 2 adjacent to the substrate 1, this monocrystalline silicon 2' itself directly absorbs the light irradiation, thereby effecting self-heating so that the monocrystalline process toward the exposed surface is somewhat accelerated. Finally, the thin film 2 is converted into a single crystalline structure in its entirety as shown in FIG. 3b. In the monocrystallized thin film 2' is typically formed a crystal grain having a representative size of d1, and this grain size increases to d2 as the annealing is continued.

In this manner, in accordance with this embodiment of the present invention, since the thin film 2 is first heated by conduction from the support plate 3 through the substrate 1, the thin film 2 is heated uniformly across its entire surface so that the process of monocrystallization also takes place uniformly across its entire surface. This contributes to obtain the monocrystallized thin film 2' uniform in structure and in characteristic. It should also be noted that it is only after the formation of seeds for monocrystallization at the surface of the thin film 2 adjacent to the substrate that the self-heating of the thin film 2 takes place, and, thus, such a self-heating process contributes to speeding up the monocrystallization process without impairing the uniform characteristic.

As a more specific example, the thin film 2 comprised of amorphous silicon was formed on the substrate 1 of transparent quartz. The substrate 1 may have the thickness $1_2$ in a range between 0.3 and 1.1 mm. Under the conditions of RF power 150 W, gas flow rate 20 SCCM, SiH$_4$ 100 %, pressure 0.1 torr, and the substrate temperature 220° C., the thin film 2 was formed on the substrate 1 to the thickness $1_1$ in a range between 0.5 and 1.0 microns, preferably 8,000 angstroms. The support plate 3 used was a silicon wafer of 4 inches in diameter and it had the (100) crystal direction and thickness $1_3$ in a range between 0.4 and 0.5 mm. The lamp anneal apparatus including the tungsten halogen lamps 4 and manufactured by A. G. Associates was used to carry out annealing in the environment of an inert gas, such as N$_2$, Ar, or Ne. It was found that the thin film 2 was monocrystallized with such a heat treatment process.

FIGS. 4a through 4c show an example of the experimental results evaluated by the Raman spectrum, which indicates that the thin film 2 was gradually monocrystallized by the above-described lamp anneal process. FIG. 4a is the case for amorphous silicon yet to be annealed; FIG. 4b is the case after implementation of lamp anneal for 60 seconds at 1,200° C.; and FIG. 4c is the case when the lamp anneal has been carried out for 120 seconds at 1,200° C. In the spectrum in each of FIGS. 4b and 4c, the Raman line is seen in the silicon crystal in the neighborhood of 520 cm$^{-1}$, which indicates that monocrystallization took place by the present lamp anneal treatment. Comparing the spectrum of FIG. 4b with that of FIG. 4c, it is seen that there is a difference in the half-width of the peak, so that it can be seen that an enhanced degree of crystallization can be obtained with the heat treatment at the conditions of 1,200° C. for 120 seconds than at the conditions of 1,200° C. for 60 seconds.

Here, the anneal power P is defined as a product between the anneal temperature (° C.) and the anneal time period (sec.). FIG. 5 shows how the density of dangling bonds varies as a function of the anneal power as measured by the electron spin resonance (ESR) method. Up to the anneal power P of 1,200×60, there is seen an increase of the spin number due to hydrogen separation, but above a reduction of the spin number is seen above the anneal power P of 800×120. This reduction of the spin number above the anneal power of 800×120 indicates the progress of monocrystallization due to the formation of Si-Si bonds. Besides, such changes of the spin number can explain the changes in the dark conductivity due to annealing. It can be said from the above considerations that the anneal power P is preferably set at 800 (° C.)×120 (sec.) or larger, and the anneal process is preferably carried out in an inert gas environment.

FIG. 6 shows the relation between the anneal power and the dark conductivity of the heat-treated thin film 2. An increase of the dark conductivity is seen up to the anneal power of 1,200 (° C.)×60 (sec.), but the dark conductivity decreases beyond that point. This trend is related to the ESR data shown in FIG. 5, and it is clear that the increase of the dark conductivity in a range of the anneal power between zero and 1,200(° C.)×60 (sec.) is attributable to the effect of hydrogen separation and the decrease of the dark conductivity in a range of the anneal power equal to and larger than 800 (° C.)×120 (sec.) is attributable to the effect of the formation of Si-Si bonds.

As described above, in accordance with the above-described aspect of the present invention, a single crystalline thin film having a large surface area can be formed with ease and in a short process period. In addition, the heating temperature can be set relatively at a low level, use may be made of a transparent, electrically insulating material, such as quartz or Corning 7059 (melting point at 844° C.), as the substrate. It should be noted that the electrically insulating substrate used herein has an electrically insulating surface on which the thin film 2 is formed however, it is not necessary for the rest of the substrate to be electrically insulating. Thus, it is possibly not necessary that the entire substrate 1 be formed from an electrically insulating material.

Referring now to FIG. 7, there is shown a method of heat-treating the thin film 2 in accordance with another embodiment of the present invention. It is to be noted that like elements are indicated by like numerals as in FIGS. 1 and 2. Thus, in the embodiment shown in FIG. 7, the substrate 1 having formed thereon the thin film 2 to be heat-treated is placed on the support plate 3 with the substrate being in contact with the plate 3. The support plate 3 is comprised of a material which has a high light absorbing characteristic for the light hv irradiated thereto. The support plate 3 is preferably comprised of a metal selected from the group consisting of Si, Mo, W, and Ta or alumina. On the other hand, the substrate 1 is comprised of a material which allows transmission of the irradiated light hv therethrough without appreciable absorption and it is preferably comprised of transparent quartz or silicon dioxide. Most preferably, the substrate 1 is comprised of a material whose optical bandgap is 5 eV or more.

In accordance with this aspect of the present invention, though not shown specifically in FIG. 7, the light hv emitted from a light source is passed through an expanding optical system to have its cross sectional area expanded before application to a desired object. Using such a magnifying optical system, even if use is made of a beam generating device for generating a laser beam or an electron beam, since the beam is expanded in cross sectional area, there will be no need to carry out scanning or the need for scanning, can be minimized. Since the beam is expanded in cross section, the light intensity per unit area decreases; however, in accordance with the present invention, the arrangement is such that the support plate 3 is comprised of a material which readily absorbs the irradiated light and this support plate 3 is first heated and then supplies heat to the thin film 2 by thermal conduction, and, thus, the team expansion presents no practical problem. It will be appreciated that the support plate 3 serves not only as a plate for supporting the substrate 1 but also as a thermal buffer for converting light energy into thermal energy.

FIGS. 8a through 8c show several specific examples for expanding a laser beam B emitted from a laser light source (not shown) so as to carry out blanket irradiation. The laser beam B may be emitted, for example, from a Cw Ar+ laser. In FIG. 8a, use is made of a trouble concave lens 15 for expanding the laser beam B such that light irradiation is effected on the portion of the support plate 3 on which the substrate 1 sits. In FIG. 8b, use is made of a pair of convex lenses 16a and 16b which are spaced apart from each other along the common optical axis which is perpendicular to the top surface of the support plate 3. In this case, the laser beam B is not expanded to cover the entire surface of the thin film 2, and, thus, the expanded beam must be scanned. However, thanks to the expansion, the need for scanning is minimized. In FIG. 8c, use is made of an optical fiber bundle 17 including a number of optical fibers which are closely packed together at the top end and which are spaced apart from one another at the bottom end, thereby expanding the laser beam B to cover the surface of the thin film 2. The embodiment shown in FIG. 8a is simple in structure and capable of covering a large surface area, but the light intensity is not uniform. In the embodiment shown in FIG. 8b, the expanded irradiation light is collimated so that the light intensity is substantially uniform; however, as pointed out above, since the range of irradiation is limited, there may be a case where scanning of the expanded beam is required. However, it is also true that the need for scanning can also be eliminated in this embodiment by using a lens larger in diameter. In the embodiment of FIG. 8c, the expanded beam must be scanned, but such scanning is minimized. It should also be noted that, as a further example, use may also be made of a cylindrical lens.

As shown in FIG. 9, when the expanded beam hv is irradiated through the amorphous silicon thin film 2, since amorphous silicon has the optical bandgap of approximately 1.7 eV, which is larger than that of single crystalline silicon, the light beam hv is very little absorbed by the thin film 2 so that the light beam hv is substantially transmitted through the thin film 2 and the transparent substrate 1 to be absorbed by the silicon wafer support plate 3. Due to this absorption, the support plate 3 is heated and this heat is applied to the thin film 2 through the substrate 1 as indicated by the wavy arrows. As a result, as shown in FIG. 10a, the initial cystallization 2' takes plate at the surface of the thin film 2 adjacent to the substrate 1. Since the crystallized silicon 2' has the relatively small optical bandgap of approximately 1.1 eV, it can absorb the irradiation light hv by itself so that the crystallized silicon 2' is also self-heated, thereby accelerating the crystallization process to the exposed surface. In this manner, the initial crystallization takes place at the surface of the thin film 2 adjacent to the substrate, and the heat produced by self-heating is not wasted but is advantageously used for further crystallization of the thin film 2. FIG. 10b shows the state when the thin film 2 is entirely crystallized, and the crystal grain is indicated by 2a. FIG. 10c shows the state when the crystallized thin film 2' is further heat-treated and thus the crystal grain 2a is somewhat increased.

Figure 11:
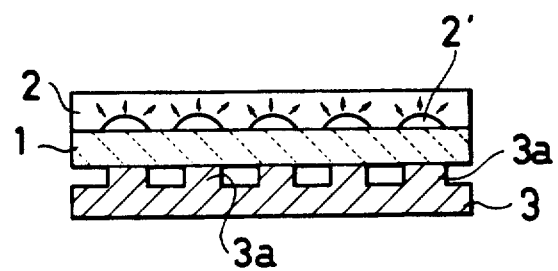
FIG. 11 is a schematic, cross sectional illustration showing a further embodiment of the present invention.

It is to be noted that, by appropriately selecting the intensity and/or time period of irradiation light, the thin film 2 can be monocrystallized at least partly or can be processed to have a microcrystalline structure. Furthermore, as shown in FIG. 11, when annealing is carried out with the substrate 1, having formed thereon the thin film 2, placed on the support plate 3 which is provided with a plurality of projections 3a at its top surface, the distribution of crystallized regions inside of the thin film 2 can be suitably controlled. That is, if annealing is carried out with the structure shown in FIG. 11, since the heat conduction is highest at those portions of the substrate which are in contact with the projections 3a, there is created a temperature distribution inside of the thin film 2 in accordance with the arrangement of the projections 3a so that crystallization takes place first at those regions of the thin film 2 which are opposite to the top surfaces of the projections 3a. It should be understood that the embodiment shown in FIG. 11 can be carried out without using the expanding optical system as shown in FIGS. 8a through 8c, and it can be used, for example, with a laser beam or one or more of tungsten halogen lamps as described previously.

In accordance with a further aspect of the present invention, a thin film formed on a substrate as deposited thereon and substantially having no semiconductor or photoconductive characteristic is activated by heat-treatment so as to exhibit a desired semiconductor or photoconductive characteristic.

That is, an amorphous silicon film formed at a low temperature below 100° C. contains more hydrogen and is higher in spin density as compared with an amorphous silicon film formed at a higher temperature in the order of 300° C. This indicates that such a film formed at lower temperatures is replete with unbonded hydrogen and silicon atoms so that the film cannot exhibit a desired semiconductor characteristic, in particular photoconductive characteristic. When such a film formed at lower temperatures was actually examined, it was found that the film did not exhibit appreciable photoconductive characteristic and served only as an electrically insulating thin film.

Thus, in accordance with this aspect of the present invention, a thin film is heat-treated in a predetermined manner so as to have the unbonded hydrogen and silicon atoms thermally activated in a short period of time, thereby causing the hydrongen and silicon atoms to be bonded together to reduce the number of the so-called dangling bonds so that the thin film can substantially exhibit a desired semiconductor or photoconductive characteristic. Of importance, in accordance with this aspect of the present invention, since the heat is absorbed into the amorphous silicon film in an extremely short period of time, the thermal conduction to the substrate on which the thin film is formed can be limited to low level, and, thus, it is possible to form a thin film capable of exhibiting a desired semiconductor or photoconductive characteristic on the substrate comprised of a material having a low melting point, such as a plastic film.

Now, a specific example of this aspect of the present invention will be described with reference to FIGS. 1 and 2. Also in this example, the thin film 2 is formed on the large top surface of the electrically insulating substrate 1 by deposition. In this embodiment, the thin film 2 is formed from silicon at low temperatures ranging from room temperature to about 100° C. by the glow discharge method, CVD method or the like so that the thin film 2 does not substantially exhibit a photoconductive characteristic and does not have a single crystalline structure. The substrate 1 having formed thereon the thin film 2 exhibiting substantially no semiconductor or photoconductive characteristic and serving simply as an electrically insulating film is placed on the support plate 3 with the substrate 1 in contact with the plate 3 as shown in FIGS. 1 and 2. The support plate 3 is comprised of a single crystalline silicon wafer having the (100) crystal orientation. Under these conditions, the tungsten halogen lamps 4 located above the thin film 2 are turned on, thereby carrying out a blanket light irradiation.

In this case, the substrate 1 is comprised of a material, or (transparent quartz in the illustrated embodiment,) which allows transmission of the light irradiation from the lamps 4. Since single crystalline silicon has a large absorbing characteristic for the light irradiation from tungsten halogen lamps, the support plate 3 vigorously absorbs the light irradiation and becomes heated, and, the support plate 3 supplies heat to the thin film 2 through the substrate 1 by heat conduction. Thus, the thin film 2 becomes first activated at the surface adjacent to the substrate 1 by recombination of silicon and hydrogen atoms as indicated by 2' in FIG. 3a. Such activation progressively takes place from the interface between the thin film 2 and the substrate 1 toward the exposed surface of the thin film 2 and finally the thin film 2 becomes entirely activated as shown in FIG. 3b so that the thin film 2 substantially exhibits a desired semiconductor or photoconductive characteristic.

Figure 12:
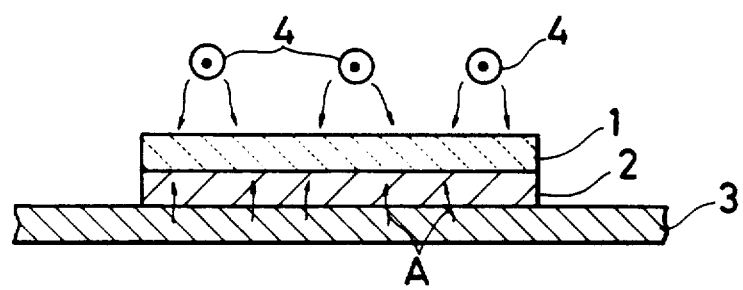
FIG. 12 is a schematic, cross sectional illustration showing a still further embodiment of the present invention, in which the substrate 2, with thin film 1 formed thereon, the thin film 1 is placed on the support plate 3, with the substrate 2 in contact with the plate 3.
Figure 13:
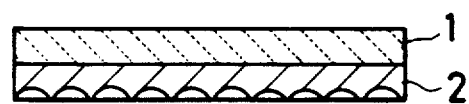
FIG. 13 is a schematic, cross sectional illustration showing how the thin film is mono-crystallized when the thin film is heat-treated in the structure shown in FIG. 12.

FIGS. 12 and 13 show another embodiment of this aspect of the present invention, which is similar to the one described immediately above with reference to FIGS. 1 and 2 in many respects excepting the fact that the substrate 1 having thereon the thin film 2 is placed on the support plate 3 with the thin film 2 located underside and thus in contact with the support plate 3. When light irradiation is carried out by the tungsten halogen lamps 4 under the condition, the light irradiation is substantially transmitted through the substrate 1 of transparent quartz and the thin film 2 of non-single crystalline silicon but becomes absorbed by the support plate 3 of single crystalline silicon. Thus, also in this embodiment, the support plate 3 is first heated and the heat is transferred directly to the thin film 2 by conduction so that the thin film 2 is gradually activated from the surface adjacent to the support plate 3 toward the interface between the thin film 2 and the substrate 1, as shown in FIG. 13. With this activation, the thin film 2 can now exhibit a desired semiconductor or photoconductive characteristic to a substantial degree. It is to be noted that since heat is directly supplied to the thin film 2 from the support plate 3 in this embodiment and not through the substrate 1 as different from the previously described embodiment, the substrate 1 is subjected to less severe heating conditions so that it may be comprised of a material having a relatively low melting point, such as a plastic film.

As a specific example, the thin film 2 of amorphous silicon was formed to the thickness $l_1$ ranging from 0.5 to 1.0 microns, preferably 8,000 angstroms, on the insulating substrate 1 of transparent quartz having the thickness $l_2$ ranging from 0.3 to 1.1 mm under the conditions of RF power 10W, gas flow rate 20 SCCM, $SiH_4$ 100%, pressure 0.1 torr, and substrate temperature ranging from room temperature to 100° C. The support plate 3 used was a silicon wafer having 4 inches of diameter, the (100) crystal orientation, and the thickness ranging from 0.4 to 0.5 mm. A lamp annealing device having the tungsten halogen lamps 4 manufactured by A. G. Associates was used to carry out heat treatment in the environment of an inert gas, such as $N_2$, Ar, or Ne. It was found that the thin film 2 was activated to exhibit a desired semiconductor, in particular photoconductive, characteristic to a substantial degree.

Figure 14:
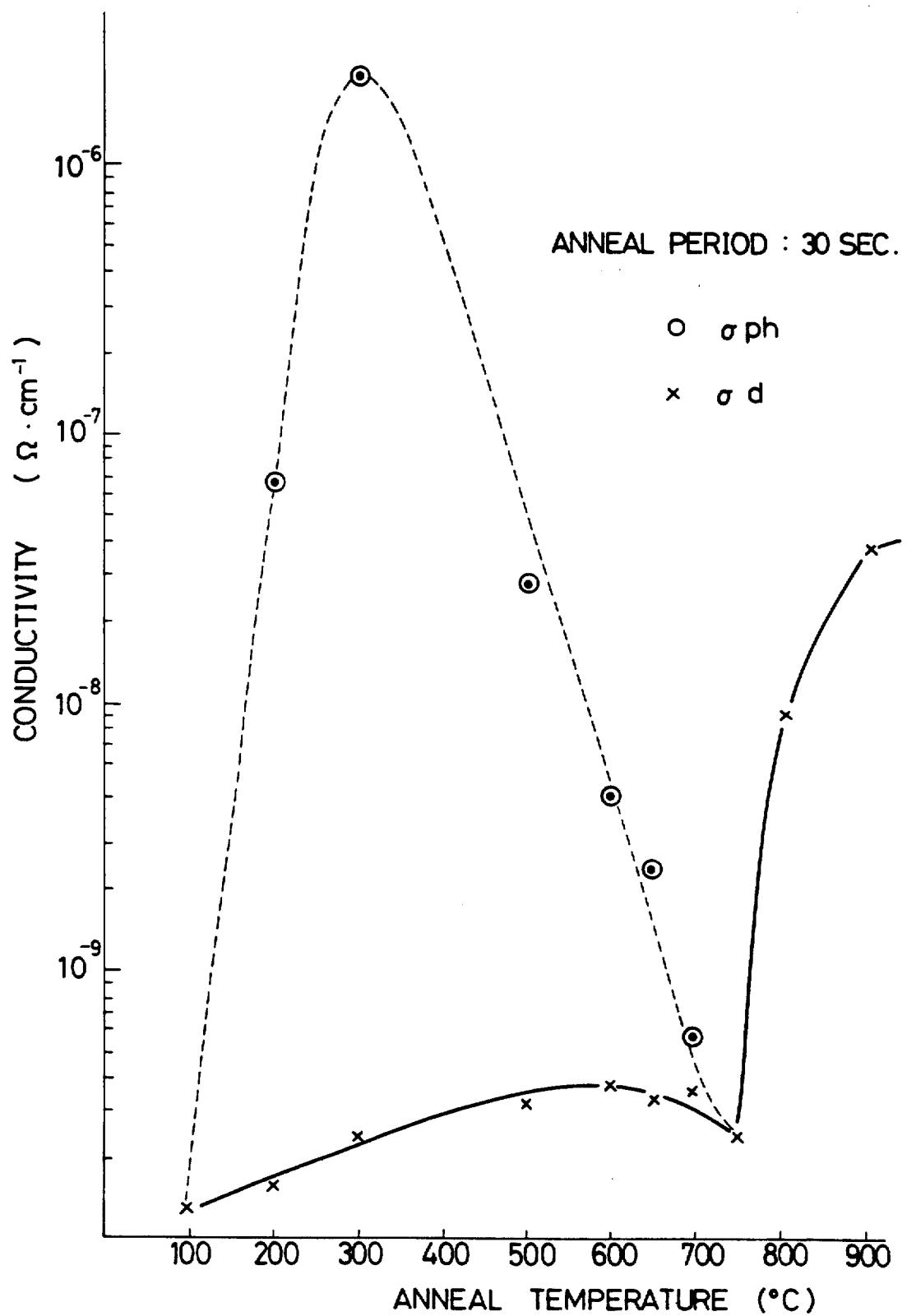
FIG. 14 is a graph showing the relation between the anneal power and the conductivity.
Figure 15:
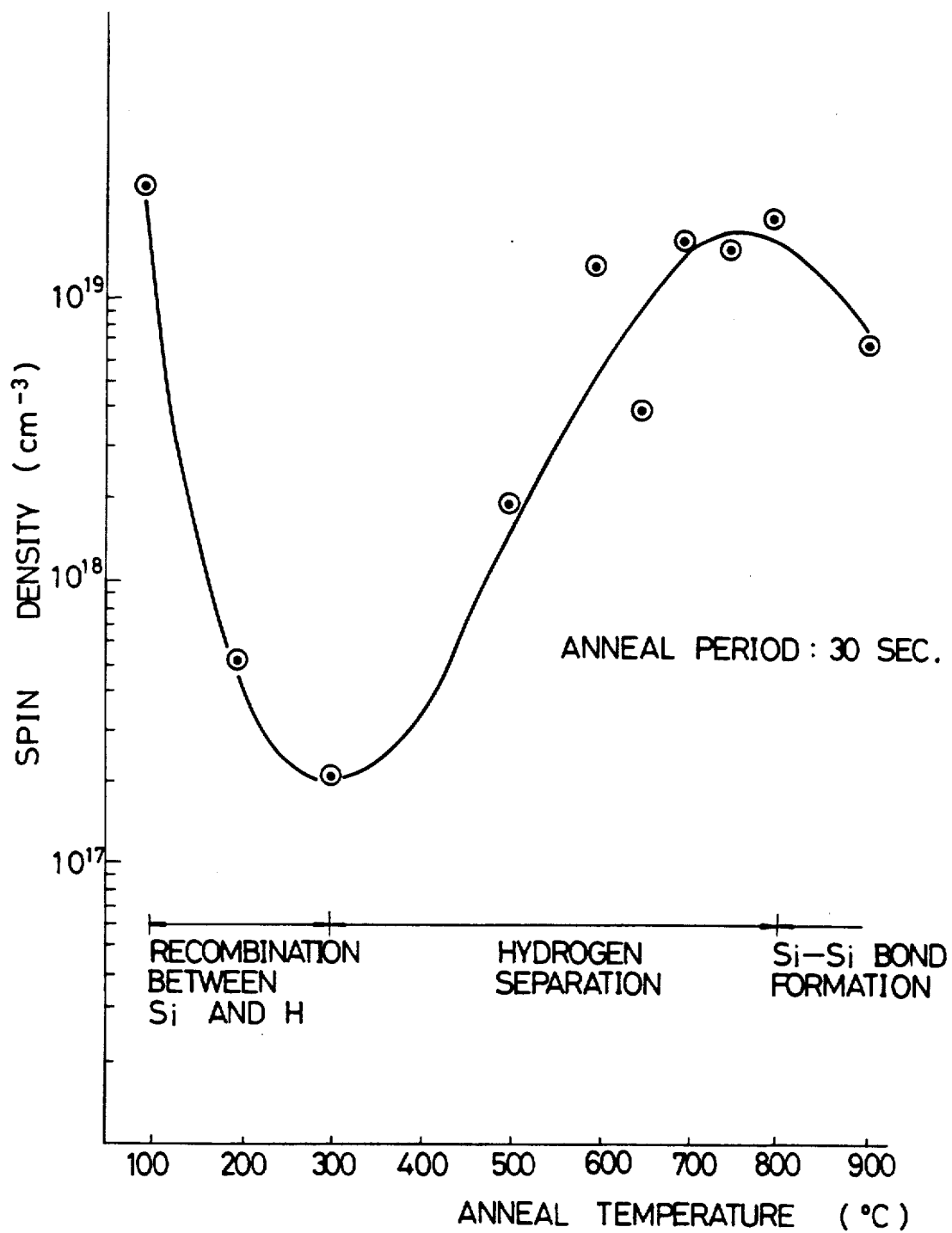
FIG. 15 is a graph showing the relation between the anneal power and the spin number.

FIG. 14 shows the relation between the anneal temperature and the photoconductivity and dark conductivity of the activated thin film 2. It is to be noted that the photoconductivity is represented by the circles and the dotted line; whereas, the dark conductivity is represented by the crosses and the solid line. Similarly as before, it is defined that the anneal power P is equal to a product between the anneal temperature (° C) and the anneal time period (sec.). Up to the anneal power P equal to 300(° C.)×30 (sec.), a gradual increase of the photoconductivity is seen and the values of the photoconductivity in the vicinity of P=300 (° C.)×30 (sec.) is equal to or above $10^{-6}$ ohms.cm$^{-1}$ so that this indicates the possibility to actually use the film as a unity magnification image sensor. This increase of the photoconductivity up to P=300 (° C.)×30 (sec.) is attributable to the effect of recombination of Si and H atoms; on the other hand, the photoconductivity decreases significantly for P=500 (° C.)×30 (sec.) or above because of the effect of hydrogen separation.

FIG. 5 shows how the density of dangling bonds measured by the electron spin resonance (ESR) method changes as a function of the anneal power. Up to the anneal power P=300 (° C.)×30 (sec.), a decrease of the spin number due to the recombination of Si and H atoms is seen, but for the anneal power P=500 (° C.)×30 (sec.) or above, an increase of the spin number is seen. The spin density again decreases when the anneal power P becomes equal to or larger than 900 (° C.)×30 (sec.) because crystallization due to the production of Si-Si bonds progresses in this region. As is obvious for one skilled in the art, the changes of the spin number can explain the changes of the light and dark conductivities of the thin film 2 by heat treatment. From the above considerations, it can be said that, when lamp anneal is to be carried out using tungsten halogen lamps, it is preferable to set the anneal power P at 300 (° C.)×30 (sec.) or above, and it is also preferable to carry out the lamp anneal in an inert gas atmosphere.

Now, a still further aspect of the present invention will be described below. This aspect of the present invention is also concerned with the method of heat treatment of a thin film to provide a single crystalline structure therein. In accordance with this aspect of the present invention, a substrate which has formed thereon a thin film yet to possess a single crystalline structure is placed on a support plate such that the thin film is located underside and thus the thin film is in direct contact with the support plate. Under the setting, a blanket light irradiation is carried out with the light having a particular wavelength which is not substantially absorbed by the substrate but is absorbed well by at least either one of the thin film and the support plate. Thus, with such light irradiation, at least either one of the thin film and the support plate becomes heated. In the case where only the support plate absorbs the irradiated light substantially, the support plate is first heated and transfers heat to the thin film by heat conduction, thereby uniformly heating the thin film directly. And, therefore, in this case, the thin film starts to be monocrystallized from the surface adjacent to the support plate and monocrystallization gradually progresses toward the interface between the thin film and the substrate. On the other hand, in the case where only the thin film absorbs the light, the thin film is the one to become heated first. In this case, the initial monocrystallization takes place in the thin film at the surface adjacent to the substrate, and it gradually progresses downward toward the outer surface in contact with the support plate 3. Furthermore, if both of the thin film 2 and the support plate 3 can absorb the light, then monocrystallization can start at the opposite surfaces of the thin film 2 simultaneously or slightly staggered in time.

A particular setting of this aspect of the present invention is similar to the one shown in FIG. 12. That is, the thin film 2 formed on the substrate 1, for example, by deposition is placed on the support plate 3 with the thin film 2 located underside and thus in contact with the support plate 3. As described above, in this embodiment the substrate 1 also is transparent quartz and the support plate 3 is a silicon wafer having the (100) crystal orientation. The thin film 2 is a film formed on the substrate by deposition, such as the glow discharge or CVD method, and, thus, it does not have a single crystalline structure and it is often times amorphous in structure. The tungsten halogen lamps 4 are arranged such that blanket irradiation of light can be carried out.

With this structure, when the lamps 4 are turned on to irradiate light, the support plate 3 of single crystalline silicon absorbs the light and first becomes heated. Then, the support plate 3 transfers heat to the thin film 2 in contact therewith so that the thin film 2 becomes heated and thus monocrystallization takes place at the surface of the thin film 2 adjacent to the support plate 3 as indicated by 2' in FIG. 16a. Then, since this monocrystallized silicon 2' can absorb the light irradiated from the lamps 4, it can self-heat by direct absorption of the light irradiation so that the monocrystallization process is accelerated toward the interface between the thin film 2 and the substrate 1. Finally, the thin film 2 is completely monocrystallized as shown in FIG. 16b, in which the crystal grain having a representative size d₁ is also indicated. Further annealing of the thin film 2 cause the crystal grain to grow as indicated in FIG. 16c. In addition, in the case where use is made of light which can also be absorbed by the thin film 2, then the monocrystallization can take place both at the opposite surfaces of the thin film 2 as indicated by 2' and 2" in FIG. 16a.

While the above provides a full and complete disclosure of the preferred embodiments of the present invention, various modifications, alternate constructions and equivalents may be employed without departing from the true spirit and scope of the invention. Therefore, the above description and illustration should not be construed as limiting the scope of the invention, which is defined by the appended claims.

What is claimed is:

1. A heat-treating method comprising the steps of:
providing a substrate of an electrically insulating material, having first and second sides opposite to each other and having formed on the first side thereof a thin film of amorphous silicon;
placing said substrate on a support plate with the second side of said substrate in contact with a first side of said support plate;
irradiating at least said support plate with blanket irradiation of light which is transmissible through said substrate without appreciable absorption and which is preferentially absorbed by and thus heats said support plate to cause said support plate to conduct sufficient heat to an entire surface of said thin film to cause said thin film to monocrystallize in a solid phase process;
wherein said irradiating is carried out from the first side of the support plate; and
removing said substrate from said support plate after said irradiating step.

2. The method of claim 1 wherein said electrically insulating forming said substrate is transparent quartz.

3. The method of claim 1 wherein said support plate includes a monocrystalline silicon and said light irradiating step is carried out by a heat-treatment using at least one tungsten halogen lamp.

4. The method of claim 3 wherein said heat treatment by said tungsten halogen lamp is carried out at least at 800° C. for at least 120 seconds.

5. The method of claim 1 wherein said electrically insulating material has an optical bandgap of at least 5 eV.

6. The method of claim 1 wherein said support plate comprises a light-absorbing material which substantially absorbs said irradiated light.

7. The method of claim 6 wherein said light-absorbing material is a material selected from the group consisting of Mo, W and Ta.

8. The method of claim 1 wherein said irradiating step is carried out in an inert gas atmosphere.

9. The method of claim 1 wherein said irradiating step is carried out in a hydrogen gas atmosphere.

10. A heat-treating method comprising the steps of:
providing a substrate having first and second sides opposite to each other and having formed on the first side thereof a thin film of amorphous silicon;
placing said substrate on a support plate with said thin film in contact with a first side of said support plate;
irradiating with blanket irradiation of light which is transmissible through said substrate without appreciable absorption and which is preferentially absorbed by at least one of said support plate and said thin film to heat-treat an entire surface of said thin film in a solid phase process causing said thin film to monocrystallize;
wherein said irradiating is carried out from the first side of the support plate; and
removing said substrate from said support plate after said irradiating step.

11. The method of claim 10 wherein said support plate includes a monocrystalline silicon and said irradiating step is carried out by using at least one tungsten halogen lamp which irradiates at the same time the entire surface of said thin film.

12. The method of claim 11 wherein said substrate includes transparent quartz.

13. The method of claim 11 wherein said heat treatment by said light irradiation is carried out at a temperature of at least 800° C. and for at least 120 seconds.

14. The method of claim 11 wherein said substrate includes an electrically insulating material having an optical bandgap energy of at least 5 eV.

15. The method of claim 10 wherein said support plate includes a light-absorbing material which substantially absorbs said irradiating light.

16. The method of claim 15 wherein said light-absorbing material is a material selected from the group consisting of Mo, W, and Ta.

17. The method of claim 10 wherein said irradiating step is carried out in an inert gas atmosphere.

18. The method of claim 10 wherein said irradiating step is carried out in a hydrogen gas atmosphere.

19. A heat-treating method comprising the steps of:
providing a substrate having formed thereon a thin film of non-monocrystalline silicon;
placing said substrate on a first side of a support plate which includes a silicon wafer;
expanding a light beam emitted from a beam emitting source; irradiating said support plate with blanket irradiation of said expanded light beam such that said light is absorbed at least initially by said support plate, which is thus heated and transfers heat to said thin film to thereby heat-treat said thin film and cause said thin film to crystallize in a solid phase process;
wherein said irradiating is carried out from the first side of the support plate; and
removing said substrate from said support plate after said irradiating step.

20. The method of claim 19 wherein said beam emitting source is a laser device.

21. The method of claim 19 wherein said thin film is monocrystallized by said heat treatment at least partly.

22. The method of claim 19 wherein said thin film is provided with a microcrystalline structure at least partly by said heat treatment.

23. A heat-treating method comprising the steps of:
providing a substrate, which includes transparent quartz, having formed thereon a thin film non-monocrystalline silicon;
placing said substrate on a first surface of a support plate of a silicon wafer, said first surface being provided with a plurality of projections so that said substrate sits on said plurality of projections and is out of contact with portions of said first surface which are between said projections;

irradiating said support plate with blanket irradiation of light such that said light is absorbed by said support plate, which is thus heated and transfers heat to said thin film by conduction to heat-treat said thin film and thereby cause at least selected portions of said thin film to crystallize;

wherein said irradiating is carried out from the side of the first surface of the support plate; and removing said substrate from said support plate after said irradiating step.

24. The method of claim 23 wherein said thin film is monocrystallized by said heat treatment at selected portions corresponding spatially to the arrangement of said plurality of projections.

25. A heat-treating method comprising the steps of:

providing a substrate having formed thereon a thin film of non-monocrystalline silicon;

placing said substrate on a first side of a support plate which includes monocrystalline silicon;

applying blanket irradiation of light by at least one tungsten halogen lamp such that said light is absorbed by said support plate, which is thus heated and transfers heat to said thin film by conduction to heat-treat said thin film, wherein said thin film is activated in a solid phase process to become capable of exhibiting a desired photoconductive semiconductor characteristic;

wherein said applying of blanket irradiating is carried out from the first side of the support plate; and removing said substrate from said support plate after said applying of blanket irradiation.

26. The method of claim 25 wherein said thin film includes silicon and a number of hydrogen atoms which are not bonded to silicon atoms before said heat treatment.

27. The method of claim 26 wherein said thin film is formed on said substrate by deposition at a temperature in the range between room temperature and 100° C.

28. The method of claim 25 wherein said substrate includes an electrically insulating material having an optical bandgap energy of at least 5 eV.

29. The method of claim 28 wherein said electrically insulating material is transparent quartz.

30. The method of claim 25 wherein said heat treatment by said light irradiation is carried out at an anneal temperature of at least 300° C. for at least 30 seconds.

31. The method of claim 25 wherein said support plate includes a light-absorbing material which substantially absorbs said irradiation light.

32. The method of claim 31 wherein said light-absorbing material is a material selected from the group consisting of Mo, W and Ta.

33. The method of claim 25 wherein said light irradiation is carried out in an inert gas atmosphere.

34. The method of claim 25 wherein said light irradiation is carried out in a hydrogen gas atmosphere.

35. The method of claim 25 wherein said substrate is placed on said support plate with said thin film at an upper side so that said substrate is in physical contact with said support plate.

36. The method of claim 25 wherein said substrate is placed on said support plate with said thin film at a lower side so that said thin film is in physical contact with said support plate.

* * * * *